(12) United States Patent
Pehlke et al.

(10) Patent No.: US 10,374,650 B2
(45) Date of Patent: *Aug. 6, 2019

(54) APPARATUS AND METHODS FOR FILTER BYPASS FOR RADIO FREQUENCY FRONT-ENDS

(71) Applicant: SKYWORKS SOLUTIONS, INC., Woburn, MA (US)

(72) Inventors: David Richard Pehlke, Westlake Village, CA (US); Stephane Richard Marie Wloczysiak, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/132,033

(22) Filed: Sep. 14, 2018

(65) Prior Publication Data

US 2019/0013836 A1    Jan. 10, 2019

Related U.S. Application Data

(63) Continuation of application No. 15/671,997, filed on Aug. 8, 2017, now Pat. No. 10,103,772.

(60) Provisional application No. 62/394,869, filed on Sep. 15, 2016, provisional application No. 62/373,256, filed on Aug. 10, 2016.

(51) Int. Cl.
*H04B 1/40* (2015.01)

(52) U.S. Cl.
CPC .................................. *H04B 1/40* (2013.01)

(58) Field of Classification Search
CPC combination set(s) only.
See application file for complete search history.

(56) References Cited

U.S. PATENT DOCUMENTS

| 6,498,926 | B1* | 12/2002 | Ciccarelli | H03F 1/0261 |
|---|---|---|---|---|
| | | | | 455/240.1 |
| 10,103,772 | B2 | 10/2018 | Pehlke et al. | |
| 2003/0073423 | A1* | 4/2003 | Cho | H04B 1/109 |
| | | | | 455/324 |
| 2004/0092243 | A1* | 5/2004 | Hey-Shipton | H04B 1/036 |
| | | | | 455/307 |
| 2005/0215204 | A1* | 9/2005 | Wallace | H04B 1/036 |
| | | | | 455/78 |
| 2010/0130153 | A1 | 5/2010 | Khoini-Poorfard et al. | |
| 2013/0273859 | A1 | 10/2013 | King et al. | |
| 2013/0273860 | A1 | 10/2013 | Pehlke | |
| 2014/0321339 | A1 | 10/2014 | Pehlke | |
| 2014/0327561 | A1 | 11/2014 | Wloczysiak | |

(Continued)

*Primary Examiner* — Junpeng Chen
(74) *Attorney, Agent, or Firm* — Knobbe Martens Olson & Bear LLP

(57) ABSTRACT

Apparatus and methods for filter bypass for radio frequency front-ends are provided. In certain configurations, a front-end system includes a low noise amplifier, a blocker filter, a plurality of switches configured to control connectivity of the blocker filter and the low noise amplifier in a signal path through the front-end system. The front-end system further includes a controller configured to control the plurality of switches to operate the front-end system in a selected mode chosen from a plurality of modes. The plurality of modes includes a first mode in which the blocker filter is before the low noise amplifier in the signal path, and a second mode in which the low noise amplifier is before the blocker filter in the signal path.

20 Claims, 10 Drawing Sheets

(56) References Cited

U.S. PATENT DOCUMENTS

| | | | |
|---|---|---|---|
| 2015/0003306 A1 | 1/2015 | Domino et al. | |
| 2015/0133067 A1 | 5/2015 | Chang et al. | |
| 2015/0172081 A1 | 6/2015 | Wloczysiak | |
| 2015/0295596 A1 | 10/2015 | Wloczysiak et al. | |
| 2015/0295597 A1 | 10/2015 | Wloczysiak | |
| 2015/0303973 A1 | 10/2015 | Wloczysiak | |
| 2015/0304000 A1 | 10/2015 | Wloczysiak | |
| 2015/0326244 A1 | 11/2015 | Wloczysiak | |
| 2016/0006556 A1 | 1/2016 | Pehlke et al. | |
| 2016/0020737 A1* | 1/2016 | Kong | H03F 3/19 455/73 |
| 2016/0126987 A1 | 5/2016 | Wloczysiak | |
| 2016/0126993 A1 | 5/2016 | Wloczysiak | |
| 2016/0126994 A1 | 5/2016 | Domino et al. | |
| 2016/0127014 A1 | 5/2016 | Wloczysiak | |
| 2016/0127015 A1 | 5/2016 | Wloczysiak et al. | |
| 2016/0127016 A1 | 5/2016 | Pehlke et al. | |
| 2016/0127025 A1 | 5/2016 | Wloczysiak | |
| 2016/0127026 A1 | 5/2016 | Wloczysiak et al. | |
| 2016/0127029 A1 | 5/2016 | Wloczysiak | |
| 2016/0241026 A1 | 8/2016 | Pehlke | |
| 2016/0241138 A1 | 8/2016 | Pehlke | |
| 2016/0241197 A1 | 8/2016 | Pehlke et al. | |
| 2016/0241294 A1 | 8/2016 | Pehlke et al. | |
| 2016/0242057 A1 | 8/2016 | Ripley et al. | |
| 2016/0301437 A1 | 10/2016 | Pehlke | |
| 2016/0322997 A1 | 11/2016 | Wloczysiak et al. | |
| 2016/0352373 A1 | 12/2016 | Wloczysiak | |
| 2016/0352374 A1 | 12/2016 | Wloczysiak | |
| 2016/0365908 A1 | 12/2016 | Chang et al. | |
| 2017/0026061 A1 | 1/2017 | Wloczysiak | |
| 2017/0026074 A1 | 1/2017 | King et al. | |
| 2017/0026090 A1 | 1/2017 | Wloczysiak | |
| 2017/0047981 A1 | 2/2017 | Wloczysiak | |
| 2017/0124013 A1* | 5/2017 | Vaillancourt | G06F 13/4022 |
| 2017/0155421 A1 | 6/2017 | Wloczysiak | |
| 2017/0195106 A1 | 7/2017 | Pehlke | |
| 2017/0222665 A1 | 8/2017 | Chang et al. | |
| 2017/0230088 A1 | 8/2017 | Wloczysiak | |
| 2017/0244538 A1 | 8/2017 | Chang et al. | |
| 2017/0279436 A1 | 9/2017 | Domino et al. | |
| 2017/0279437 A1 | 9/2017 | Domino et al. | |
| 2017/0317710 A1 | 11/2017 | Liu et al. | |
| 2017/0324451 A1 | 11/2017 | Wloczysiak | |
| 2017/0373730 A1 | 12/2017 | Pehlke | |

* cited by examiner

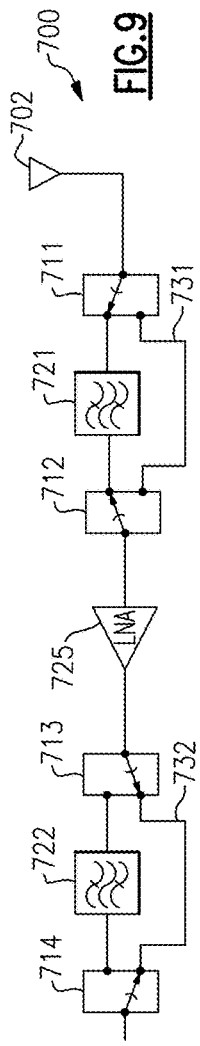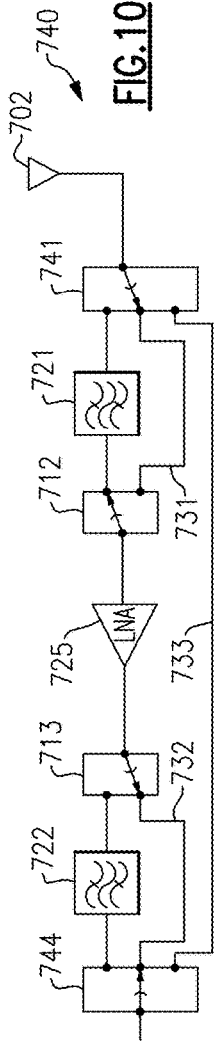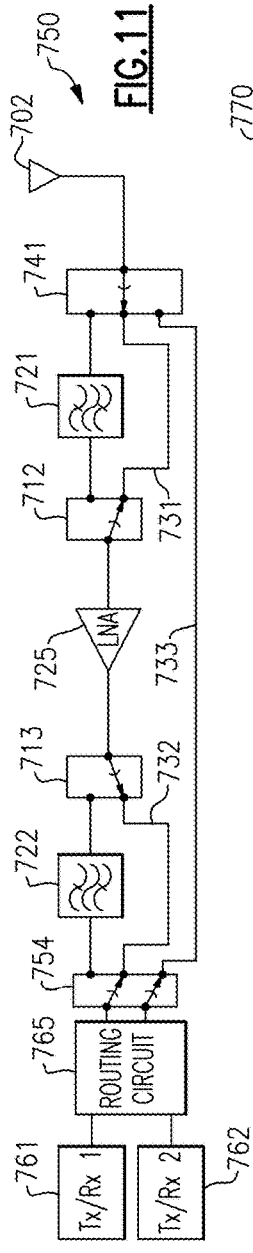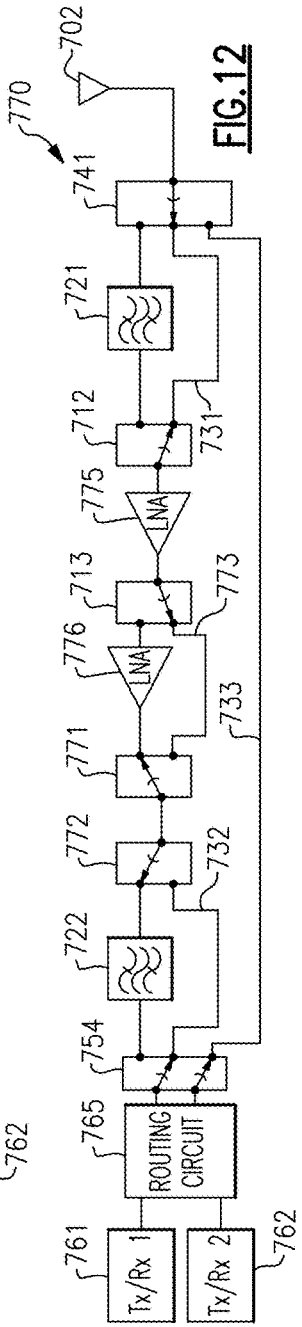

APPARATUS AND METHODS FOR FILTER BYPASS FOR RADIO FREQUENCY FRONT-ENDS

CROSS-REFERENCE TO RELATED APPLICATIONS

This application is a continuation of U.S. application Ser. No. 15/671,997, filed Aug. 8, 2017, and titled "APPARATUS AND METHODS FOR FILTER BYPASS FOR RADIO FREQUENCY FRONT-ENDS," which claims the benefit of priority under 35 U.S.C. § 119(e) of U.S. Provisional Patent Application No. 62/394,869, filed Sep. 15, 2016 and titled "APPARATUS AND METHODS FOR FILTER BYPASS FOR RADIO FREQUENCY FRONT-ENDS," and of U.S. Provisional Patent Application No. 62/373,256, filed Aug. 10, 2016 and titled "APPARATUS AND METHODS FOR FILTER BYPASS FOR RADIO FREQUENCY FRONT-ENDS," each of which is herein incorporated by reference in their entireties.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 450 MHz to about 6 GHz for certain communications standards.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes an antenna, a front-end system configured to generate a radio frequency signal based on processing a received signal from the antenna, and a transceiver configured to receive the radio frequency signal and to operate the front-end system in a selected mode chosen from a plurality of modes. The front-end system includes one or more filters for providing blocker filtering, and the transceiver is further configured to change an amount of blocker filtering provided by the front-end system based on the selected mode.

In some embodiments, the plurality of modes includes a plurality of automatic gain control modes.

In various embodiments, the transceiver includes a blocker detector configured to detect a blocker signal level based from the radio frequency signal, and the transceiver is further configured to choose the selected mode based on the detected blocker signal level.

In a number of embodiments, the front-end system includes a receive bypass path configured to bypass the one or more filters, and the transceiver is further configured to select the receive bypass path in at least one of the plurality of modes.

According to some embodiments, the one or more filters includes at least one tunable filter, and the transceiver is further configured to tune the at least one tunable filter based on the selected mode.

In several embodiments, the front-end system includes a low noise amplifier.

In accordance with various embodiments, the transceiver is further configured to change at least one of a bias or a gain of the low noise amplifier based on the selected mode.

In a number of embodiments, the transceiver is further configured to bypass the low noise amplifier in at least one of the plurality of modes.

In various embodiments, the low noise amplifier includes two or more stages arranged in a cascade, and the transceiver is further configured to bypass at least one of the two or more stages in at least one of the plurality of modes.

In some embodiments, the transceiver is further configured to change an order in a signal path of the low noise amplifier and at least one of the one or more filters based on the selected mode.

According to a number of embodiments, the one or more filters includes a first filter before the low noise amplifier in a signal path and a second filter after the low noise amplifier in the signal path. In various embodiments, the transceiver is further configured to bypass at least one of the first filter or the second filter in at least one of the plurality of modes.

In some embodiments, the transceiver includes an automatic gain control system configured to choose the selected mode.

In several embodiments, the automatic gain control system includes a table of gain settings, and one or more gain settings of the table indicate activation of a receive bypass path that bypasses the one or more filters.

In various embodiments, the selected mode is controllable over a serial interface. In a number of embodiments, the serial interface is a Mobile Industry Processor Interface (MIPI) bus.

In accordance with a number of embodiments, the one or more filters includes a plurality of receive band filters associated with two or more frequency bands.

In some embodiments, the front-end system is implemented using time division duplexing.

In several embodiments, the front-end system is implemented using frequency division duplexing.

In certain embodiments, the present disclosure relates to a front-end system for a radio frequency communication device. The front-end system includes one or more filters for providing blocker filtering of a signal received by an antenna, a plurality of switches configured to control connectivity of the one or more filters, and a controller configured to control the plurality of switches to operate the front-end system in a selected mode chosen from a plurality of modes, and to change an amount of blocker filtering provided by the one or more filters based on the selected mode.

In some embodiments, the plurality of modes includes a plurality of automatic gain control modes.

In various embodiments, the front-end system further includes a receive bypass path configured to bypass the one or more filters, and the controller is further configured to select the receive bypass path in at least one of the plurality of modes.

In a number of embodiments, the one or more filters includes at least one tunable filter, and the controller is further configured to tune the at least one tunable filter based on the selected mode.

In several embodiments, the front-end system further includes a low noise amplifier.

According to various embodiments, the controller is further configured to change at least one of a bias or a gain of the low noise amplifier based on the selected mode.

In some embodiments, the controller is further configured to bypass the low noise amplifier in at least one of the plurality of modes.

In a number of embodiments, the low noise amplifier includes two or more stages arranged in a cascade, and the controller is further configured to bypass at least one of the two or more stages in at least one of the plurality of modes.

In several embodiments, the controller is further configured to change an order in a signal path of the low noise amplifier and at least one of the one or more filters based on the selected mode.

In various embodiments, the one or more filters includes a first filter before the low noise amplifier in a signal path and a second amplifier after the low noise amplifier in the signal path. According to some embodiments, the controller is further configured to bypass at least one of the first filter or the second filter in at least one of the plurality of modes.

In a number of embodiments, the controller is controllable over a serial interface. In various embodiments, the serial interface is a MIPI bus.

According to several embodiments, the one or more filters includes a plurality of receive band filters associated with two or more frequency bands.

In some embodiments, the front-end system is implemented using time division duplexing.

In accordance with various embodiments, the front-end system is implemented using frequency division duplexing.

In certain embodiments, the present disclosure relates to a method of receiving signals in user equipment of a wireless communication network. The method includes providing a received signal from an antenna to a front-end system that includes one or more filters for providing blocker filtering, generating a radio frequency signal based on the received signal using the front-end system, operating the front-end system in a selected mode chosen from a plurality of modes, and changing an amount of blocker filtering provided by the front-end system based on the selected mode.

In some embodiments, the method further includes detecting a blocker signal level of the antenna, and choosing the selected mode based on the detected blocker signal level.

In a number of embodiments, the method further includes bypassing the one or more filters using a receive bypass path in at least one of the plurality of modes.

In various embodiments, the one or more filters includes at least one tunable filter, and the method further includes tuning the at least one tunable filter based on the selected mode.

In several embodiments, generating the radio frequency signal includes providing amplification using a low noise amplifier in one or more of the plurality of modes.

In several embodiments, the method further includes controlling at least one of a bias or a gain of the low noise amplifier based on the selected mode.

In some embodiments, the method further includes bypassing the low noise amplifier in at least one of the plurality of modes.

In a number of embodiments, the low noise amplifier includes two or more stages arranged in a cascade, and the method further includes bypassing at least one of the two or more stages in at least one of the plurality of modes.

In various embodiments, the method further includes changing an order in a signal path of the low noise amplifier and a filter in at least one of the plurality of modes.

According to several embodiments, the method further includes choosing the selected mode via a serial interface.

In certain embodiments, the present disclosure relates to a radio frequency communication system includes a baseband processor, a transmit chain configured to process transmit data from the baseband processor to generate a radio frequency transmit signal, a receive chain configured to process a radio frequency receive signal to generate receive data for the baseband processor, one or more antennas, and a front-end system configured to control access of the transmit chain and the receive chain to the one or more antennas. The front-end system including one or more filters for providing blocker filtering and at least one bypass path for bypassing the one or more filters.

In a number of embodiments, the at least one bypass path includes a receive bypass path operable to couple the receive chain to an antenna in a signal path that bypasses the one or more filters.

In some embodiments, the baseband processor includes an automatic gain control system configured to control activation of the receive bypass path. In various embodiments, the automatic gain control system includes a table of gain settings, the table having one or more gain settings indicating activation of the receive bypass path.

In varying embodiments, the at least one bypass path includes a transmit bypass path operable to couple the transmit chain to an antenna in a signal path that bypasses the one or more filters.

In several embodiments, the front-end system is implemented using time division duplexing.

In a number of embodiments, the front-end system is implemented using frequency division duplexing.

BRIEF DESCRIPTION OF THE DRAWINGS

FIG. 9 is a schematic diagram of a receiver front-end system according to another embodiment.

FIG. 10 is a schematic diagram of a receiver front-end system according to another embodiment.

FIG. 11 is a schematic diagram of a receiver front-end system according to another embodiment.

FIG. 12 is a schematic diagram of a receiver front-end system according to another embodiment.

DETAILED DESCRIPTION OF EMBODIMENTS

Figure 1:
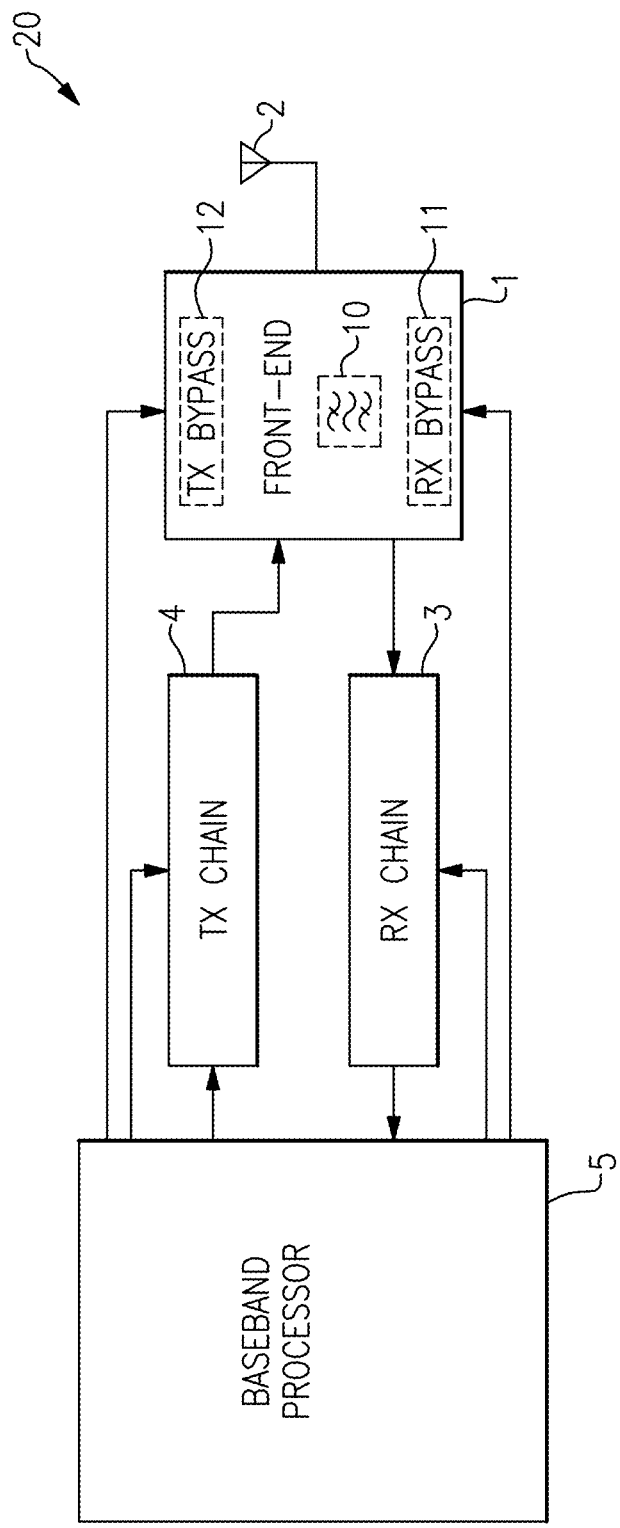
FIG. 1 is a schematic diagram of one embodiment of an RF communication system.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A front-end radio architecture can use filtering for attenuation of transmit emissions and/or attenuation of out-of-band interferers. Such filtering can be provided for coexistence considerations either in-phone or between user equipment (UE) and external radio environments.

Including such filters achieves desired performance specifications, including in worst-case coexistence conditions. However, such filters also introduce insertion loss in the active pass band, for instance, insertion loss in the range of 1 dB to 3 dB. Such insertion loss results in a power amplifier in a transmit chain operating with higher output power. Additionally, such insertion loss degrades receive sensitivity in receivers.

Although filter insertion loss undesirably degrades important transmit and receive performance specifications, such filters are used to obtain desired coexistence performance.

As the interference environment and desired signal levels change, automatic gain control (AGC) in both transmit and receive paths can be utilized. AGC can include changing the gain of active components of transmit and/or receive chains to adjust gain and linearity dynamically to enhance transmission and/or reception performance.

However, filters in both transmit and receive chains support worst-case coexistence specifications, and penalize the primary passband operation, typically after the power amplifier in the transmit chain, and before the low noise amplifier (LNA) in the receive chain.

In certain configurations herein, filter connectivity is changed as a function of automatic gain control (AGC) in a receive path. For example, lossy filtering can be bypassed when signal conditions and the interference environment surrounding the UE allow. In certain implementations, an additional gain state is added to the AGC in the form of a bypass of the filtering. Thus, receiver gain and noise figure are greatly improved while the linearity and susceptibility to blockers is degraded.

Dynamic assessment of the radio environment may allow such operations, and if interferers arise that degrade the receiver performance, then the AGC system can switch the filter back into the receive path. A receive environment can be detected in a variety of ways, such as via a received signal strength indicator (RSSI) or other indication of signal-to-noise ratio (SNR), via processing in a diversity path, via a dedicated blocker detection chain, and/or in any other suitable way.

Thus, AGC can be extended to include a gain state that provides filter-less reception of signals. Similar to other gain states of the receive AGC, desired signal conditions can be used to control the selected gain setting to manage in-band gain and linearity. Additionally, when external interference degrades in-band SNR, the AGC system can include the filter in the receive path as needed. Furthermore, as the filters before and/or after a receiver LNA are switched in or out an assessment can be made to provide an enhanced receive sensitivity.

On the transmit side, assessment of the received signal as well as the surrounding UEs that may be affected can be assessed to determine if the additional transmit emissions are acceptable to the link and to the surrounding UE and general network performance. Thus, a transmit filter can be selectively bypassed to reduce transmit path insertion loss, while increasing spurious and/or harmonic transmissions.

Adjustment of the transmit in-band power can be made along with additional information that the network has for the surrounding UEs and potential victims of higher emission levels nearby. If configurations in which the system/network is sufficiently sophisticated to assess whether or not a relaxed environment is acceptable, significant benefit for the transmit output power and DC consumption can also be gained.

The teachings herein can provide enhanced performance in a wide variety of networks, including, but not limited to, networks using small cells and/or highly directional short range communication. For example, 5G systems can operate using very small network cells and multiple-input multiple-output (MIMO) systems operating with beamforming. In such implementations, there is a relatively high statistical likelihood that a particular user is isolated from other users of the network. Thus, users of such a network can operate using transmit and/or receive bypass a relatively large percentage of the time, which in turn leads to increased network performance.

The teachings herein are applicable to both TDD and FDD systems.

For example, a TDD system can include a bypass of a shared transmit/receive filter. Additionally, since transmission and reception occur sequentially, the shared transmit/receive filter can be bypassed for both transmit and receive, for transmit but not receive, for receive but not transmit, or for neither transmit nor receive. Thus, the reconfiguration of transmit and receive bypass can be managed separately.

In certain implementations, an FDD system is implemented to provide separate control over transmit and receive bypass. In one example, separate transmit and receive antennas can be used for FDD communications via a simplex architecture. In another example, a circulator is used to connect transmit and receive circuitry to a common antenna. In yet another example, low loss diplex filtering is used in which transmit and receive within a band group are kept separate and combined with different band group frequencies through the diplex function before reaching connection to the antenna.

FIG. 1 is a schematic diagram of one embodiment of an RF communication system 20. The RF communication system 20 includes a front-end 1, an antenna 2, a receiver chain 3, a transmitter chain 4, and a baseband processor 5.

As shown in FIG. 1, the front-end 1 includes filters 10, a receive filter bypass 11, and a transmit filter bypass 12.

The RF communication system 20 of FIG. 1 illustrates one example of a RF communication system that can include one or more filter bypass paths. However, the teachings herein are applicable to RF communication systems implemented in a wide variety of ways.

When the RF communication system 20 is operating in certain environments, the RF communication system 20 can enable the receive filter bypass 11 to bypass the filters 10. By bypassing the filters 10, received signal strength can be enhanced.

By increasing received signal strength, the RF communication system 20 can receive signals from greater distances. Additionally, an increase in signal strength leads to a higher SNR, which in turn permits lower redundancy and higher data rates or speeds.

For example, an increase in received signal strength can result in a change of encoding format, for instance from QPSK to 16-QAM, thereby providing less redundancy and higher bit rate. A change in received signal strength can further impact performance via changes to operation of diversity and/or MIMO.

Additionally, the RF communication system 20 can operate with enhanced performance specifications, such as superior reference sensitivity. As persons having ordinary skill in the art will appreciate, a reference sensitivity test can measure a communication system's performance with respect to processing received signals of relatively low signal strength.

When the RF communication system 20 is operating in certain environments, the RF communication system 20 can enable the transmit filter bypass 12 to bypass the filters 10. By bypassing the filters 10, transmit power can be decreased, since a transmit signal form the transmit chain 4 can reach the antenna 2 without the insertion loss of the filters 10.

Decreasing transmit power can enhance performance, including extending battery life and/or reducing heat dissipation in the RF communication system 20.

Although illustrated with respect to a single antenna, the teachings herein are applicable to multi-antenna configurations. In one example, multiple antennas are used for FDD. In another example, a diversity antenna is used. The diversity antenna and/or other antennas can include transmit and/or receive bypass paths.

Figure 2:
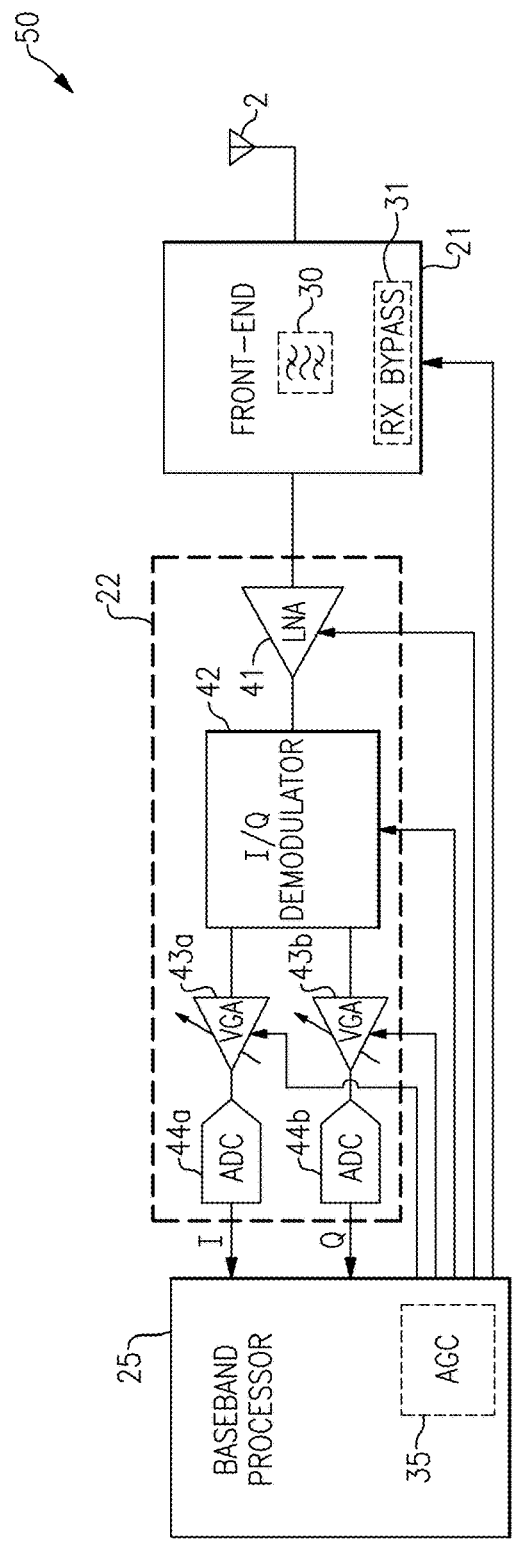
FIG. 2 is a schematic diagram of a receiver system according to one embodiment.

FIG. 2 is a schematic diagram of a receiver system 50 according to one embodiment.

The receiver system 50 includes an antenna 2, a front-end 21, a receiver chain 22, and a baseband processor 25. The front-end 21 includes filters 30 and a receive filter bypass 31. Additionally, the receiver chain 22 includes an LNA 41, an I/Q demodulator 42, an I-path variable gain amplifier (VGA) 43a, a Q-path VGA 43b, an I-path analog-to-digital converter (ADC) 44a, and a Q-path ADC 44b. The baseband processor 25 includes an AGC system 35.

The AGC system 35 can adjust gain of components in the receiver chain 22 in order to achieve an in-band component of the received signal at a desired strength. The AGC system 35 can provide gain control that positions the received input signal in about the middle of a dynamic range of the ADCs 44a, 44b. Providing gain control in this manner aids in generating a received signal of an appropriate level, and enhances the integrity of signal reception in the receiver system 50.

In the illustrated example, the AGC system 35 generates gain controls signals for the LNA 41, the I/Q demodulator 42 (for instance, mixer gain control), and the VGAs 43a, 43b. However, other implementations of gain control are possible.

The digital I signal and the digital Q signal from the I-path ADC 44a and the Q-path ADC 44b, respectively, can be processed by the baseband processor 25 to determine an RSSI. The RSSI can be used by the AGC system 35 to select an appropriate gain state associated with particular gain settings of one or more gain controls signals.

The RSSI indicates a quality index of received signals, and can be compared to an expected signal strength level. When the RSSI is relatively low, the AGC system 35 can change the AGC state to increase the gain. For instance, the AGC system 35 can include a receiver AGC table of AGC states, and can change the AGC state from one state to another based on the RSSI. Thus, the AGC system 35 can change AGC state until RSSI has a desired value or is within a range of desired values.

In certain configurations, the receive filter bypass 31 is activated in one or more AGC settings or states. In one embodiment, the receive filter bypass 31 is activated in a highest gain setting of the AGC system 35, such as a highest gain value in the receiver AGC table. Thus, when received signal strength is relatively weak, the AGC system 35 can bypass the front-end's filters to receive the signal without the attenuation of the filters. When the RSSI increases in response to bypassing the filters, signal integrity is enhanced. However, when the RSSI decreases in response to bypassing the filters, the AGC system 35 can back out of the bypass state.

The illustrated receiver system 50 can exhibit superior performance in a reference sensitivity test. For example, as signal strength decreases during the reference sensitivity test, the AGC system 35 can increase gain of the receive chain 22. Additionally, as the signal strength is relatively weak and receive chain 22 is operating with a maximum gain level, the AGC system 35 can bypass the front-end's filters, thereby increasing signal strength by avoiding filter insertion loss.

Accordingly, the receiver system 50 can detect signals of smaller strength, and exhibit superior performance specifications with respect to reference sensitivity.

The baseband processor 25 can provide digitally channel filtering to remove received signal components associated with blockers and/or other desired signal components. Thus, when the receive filter bypass 31 is activated, digital filtering in the baseband processor 25 can be used to recover a desired signal. Thus, the receiver system 50 can reliable receive signals even when the filters 30 are bypassed.

Figure 3:
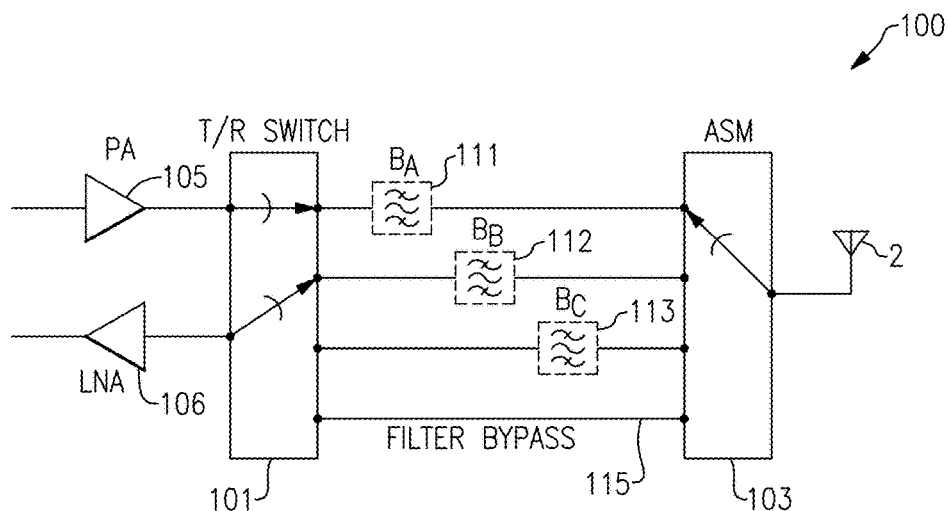
FIG. 3 is a schematic diagram of one embodiment of an RF front-end system operating with time division duplexing (TDD).

FIG. 3 is a schematic diagram of one embodiment of an RF front-end system 100 operating with TDD. The RF front-end system 100 is connected to an antenna 2, and includes a transmit/receive (T/R) switch 101, an antenna switch module (ASM) 103, a power amplifier 105, an LNA 106, a first band filter 111, a second band filter 112, a third band filter 113, and a filter bypass 115.

The RF front-end system 100 of FIG. 3 illustrates one specific embodiment of filter bypass for a system operating with TDD. However, a wide variety of bypass architectures can be used, including, for example, configurations with more or fewer bands, switches, and/or other components.

To receive signals, the LNA 106 is connected to antenna 2 through a selected path between the T/R switch 101 and the ASM 103. Additionally, to transmit signals, the power amplifier 105 is connected to the antenna 2 through a selected path between the T/R switch 101 and the ASM 103. The ASM 103 can also be referred to as an antenna switch.

With respect to reception of signals, the filtering provided by the band filters 111-113 can reduce blockers down such that an overall linearity is achieved. With respect to transmission of signals, the filtering provided by the band filters 111-113 can reduce spurious and/or out-of-band transmission.

The band filters 111-113 can be used to attenuate interference, including, but not limited to, interference from transmitters of other UE and/or from in-phone transmitters. For instance, certain phones can include a primary transmitter, such as a cellular transmitter, and an auxiliary transmitter, such as a Wi-Fi transmitter, and the band filters 111-113 aid in providing in-phone coexistence.

The illustrated RF front-end system 100 includes the filter bypass 115, which can be used to bypass the band filters 111-113 to provide reception and/or transmission of signals without the insertion loss of the band filters 111-113.

Although the illustrated filter bypass 115 includes a direct connection between the T/R switch 101 and the ASM 103, other implementations are possible. For example, the filter bypass 115 can include a filter having a smaller amount of attenuation relative to the band filters 111-113. Moreover, the teachings herein are applicable to implementations using multiple bypass paths, including, but not limited to, bypass paths having filters of varying strengths.

The illustrated RF front-end system 100 operates with TDD, and thus transmission and reception occurs at different time instances, in this example. Accordingly, the filter bypass 115 can be selected when transmitting and receiving, when transmitting but not when receiving, when receiving but not transmitting, or neither when transmitting nor receiving. Moreover, the use of the filter bypass 115 is dynamically controlled over time based on operating environment.

In one embodiment, use of the filter bypass 115 is controlled via controls signals from a baseband processor. For example, the baseband processor can generate signals that control selection of the T/R switch 101 and the ASM 103.

Figure 4:
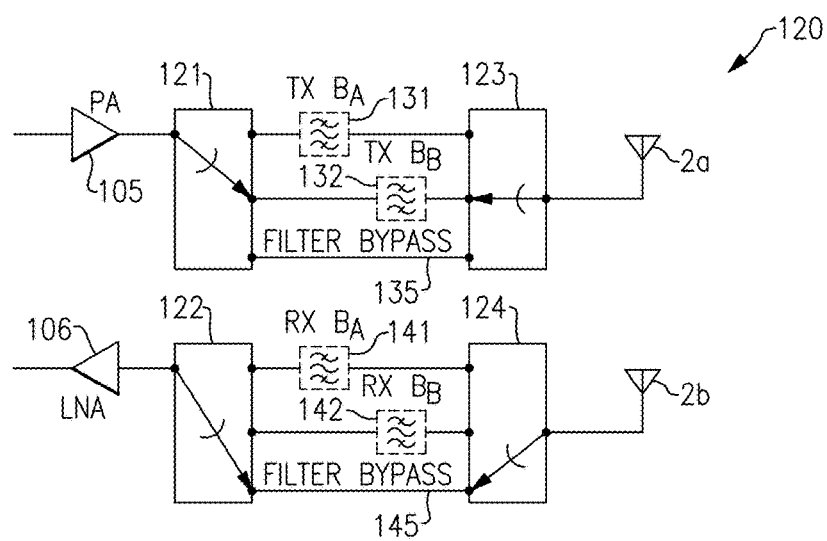
FIG. 4 is a schematic diagram of one embodiment of an RF front-end system operating with frequency division duplexing (FDD).

FIG. 4 is a schematic diagram of one embodiment of an RF front-end system 120 operating with FDD.

The RF front-end system 120 is connected to a transmit antenna 2a and a receive antenna 2b, and includes a power amplifier 105, an LNA 106, a transmit switch 121, a receive switch 122, a first ASM 123, a second ASM 124, a first transmit band filter 131, a second transmit band filter 132, a transmit filter bypass 135, a first receive band filter 141, a second receive filter 142, and a receive filter bypass 145.

The RF front-end system 120 of FIG. 4 illustrates one specific embodiment of filter bypass for a system operating with FDD. However, a wide variety of bypass architectures can be used, including, for example, configurations with more or fewer bands, switches, and/or other components.

In the illustrated embodiment, a simplex architecture with separate transmit and receive antennas is used. However, other implementations are possible. For example, a single antenna can be used in combination with a circulator or low loss duplexer.

Figure 5:
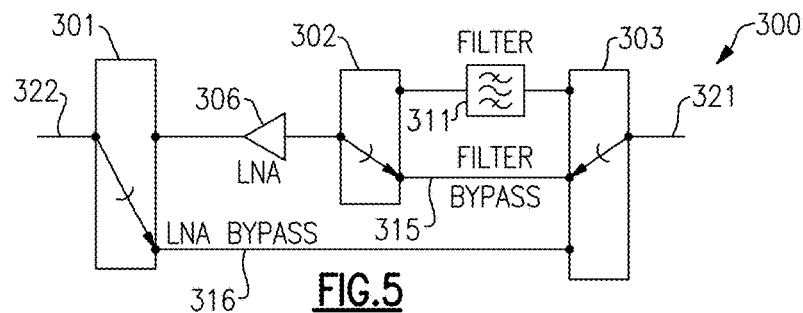
FIG. 5 is a schematic diagram of a receiver front-end system according to another embodiment.

FIG. 5 is a schematic diagram of a receiver front-end system 300 according to another embodiment. The receiver front-end system 300 includes an LNA bypass switch 301, a filter bypass switch 302, an antenna switch 303, an LNA 306, and a receive band filter 311.

In the illustrated embodiment, the antenna switch 303 selectively routes a received signal 321 to an input of the receive band filter 311 for filtering, to the receive filter bypass 315, or to the LNA bypass 316. Additionally, the filter bypass switch 302 selectively routes an output of the receive band filter 311 or the receive filter bypass 315 to an input of the LNA 306. Furthermore, the LNA bypass switch 301 selects an output of the LNA 306 or the LNA bypass 316 to provide as an output signal 322.

Accordingly, in this example, the receive filter bypass 315 can be used to bypass the receive band filter 311 but not the LNA 306, and the LNA bypass 316 can be used to bypass both the receive band filter 311 and the LNA 306. Implementing the receiver front-end system 300 in this manner enhances flexibility in controlling an amount of filtering and amplification provided to the received signal 321.

Although FIG. 5 illustrates one specific embodiment of filter and LNA bypass, a wide variety of bypass architectures can be used, including, for example, configurations with additional filters, switches, and/or other components and/or a different arrangement of components.

Figure 6:
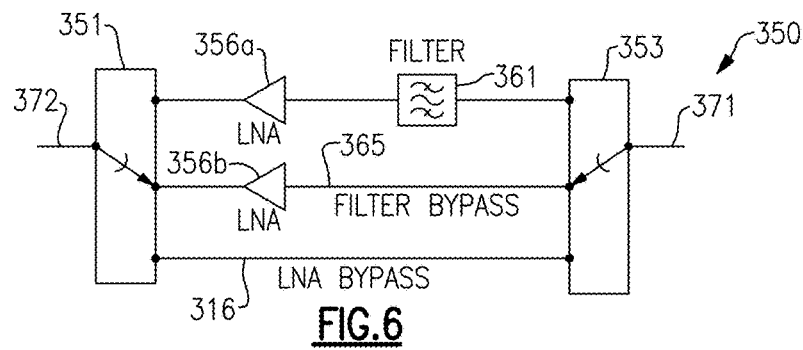
FIG. 6 is a schematic diagram of a receiver front-end system according to another embodiment.

FIG. 6 is a schematic diagram of a receiver front-end system 350 according to another embodiment. The receiver front-end system 350 includes a bypass switch 351, an antenna switch 353, a receive band filter 361, a first LNA 356a, and a second LNA 356b. The receiver front-end system 350 receives a receive signal 371 and generates an output signal 372.

In the illustrated embodiment, the bypass switch 351 and the antenna switch 353 can operate to select a first path associated with the receive band filter 361 and the first LNA 356a, a second path associated with the second LNA 356b and the filter bypass 365, or a third path associated with the LNA bypass 316.

Accordingly, in this example, the receive filter bypass 365 can be used to bypass the receive band filter 311 and the first LNA 356a but not the second LNA 356b, and the LNA bypass 366 can be used to bypass the receive band filter 311 and the first and second LNAs 356a, 356b. Implementing the receiver front-end system 300 in this manner enhances flexibility in controlling an amount of filtering and amplification provided to the received signal 371. For example, the first path provides both filtering by the receive band filter 361 and amplification by the first LNA 356a, the second path provides amplification by the second LNA 356b, and the third path bypasses filter and LNA circuitry. The first and second LNAs 356a, 356b can provide the same or different amounts of amplification, based on implementation.

Although FIG. 6 illustrates one specific embodiment of filter and LNA bypass, a wide variety of bypass architectures can be used, including, for example, configurations with additional filters, switches, and/or other components and/or a different arrangement of components.

Figure 7:
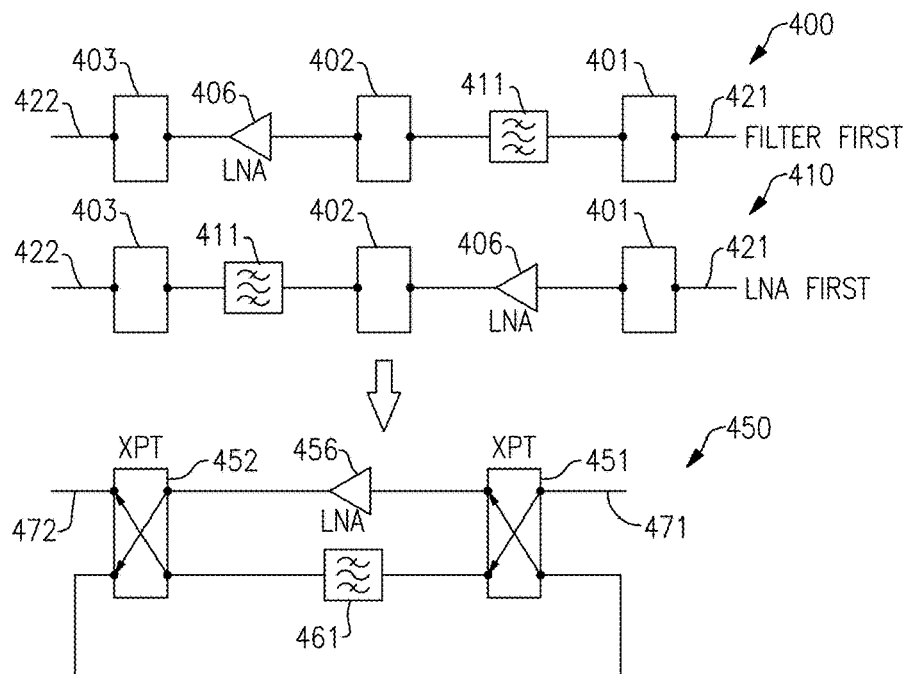
FIG. 7 is a schematic diagram of a receiver front-end system according to another embodiment.

FIG. 7 is a schematic diagram of a receiver front-end system 450 according to another embodiment. The receiver front-end system 450 includes a first crosspoint switch 451, a second crosspoint switch 452, a receive band filter 461, and an LNA 456. The receiver front-end system 450 receives a receive signal 471 and generates an output signal 472.

As shown in FIG. 7, the schematic diagram has also been annotated to show a filter first receive system 400 including a cascade of a first switch component 401, a receive band filter 411, a second switch component 402, an LNA 406, and a third switch component 403. Additionally, the schematic diagram has been annotated to show an LNA first receive system 410 including a cascade of the first switch component 401, the LNA 406, the second switch component 402, the receive band filter 411, and the third switch component 403. Both the filter first receive system 400 and the LNA first receive system 410 process a receive signal 421 to generate an output signal 422, but include a different order of the receive band filter 411 and the LNA 406 in cascade.

The receiver front-end system 450 includes first and second cross-point switches 451, 452, which can be used to implemented a filter first receive system, an LNA first receive system, as well as to bypass the receive band filter 461 or the LNA 456.

For example, in a filter first configuration, the first cross-point switch 451 can provide the receive signal 471 to an input of the receive band filter 461, and the second cross-point switch 452 can connect an output of the receive band filter 461 to the first cross-point switch 451 via a loopback path 475. Additionally, the first cross-point switch 451 can connect the loopback path 475 to an input of the LNA 456, and the second cross-point switch 452 can provide the output signal 472 by selecting an output of the LNA 456.

Additionally, in an LNA first configuration, the first cross-point switch 451 can provide the receive signal 471 to the input of the LNA 456, and the second cross-point switch 452 can connect the output of the LNA 456 to the first cross-point switch 451 via the loopback path 475. Additionally, the first cross-point switch 451 can connect the loopback path 475 to the input of the receive band filter 461, and the second cross-point switch 452 can provide the output signal 472 by selecting the output of the receive band filter 461.

Furthermore, in a filter bypass configuration, the first cross-point switch 451 can provide the receive signal 471 to the input of the LNA 456, and the second cross-point switch 452 can provide the output signal 472 by selecting the output of the LNA 456.

Additionally, in an LNA bypass configuration, the first cross-point switch 451 can provide the receive signal 471 to the input of the receive band filter 461, and the second cross-point switch 472 can provide the output signal 452 by selecting the output of the receive band filter 461.

Implementing the receiver front-end system 450 in this manner enhances flexibility in controlling an amount of filtering and amplification provided to the received signal 471, including control over an order of an LNA and a receive band filter in a cascade.

Although FIG. 7 illustrates one specific embodiment of filter and LNA bypass, a wide variety of bypass architectures can be used, including, for example, configurations with additional filters, switches, and/or other components and/or a different arrangement of components.

Figure 8:
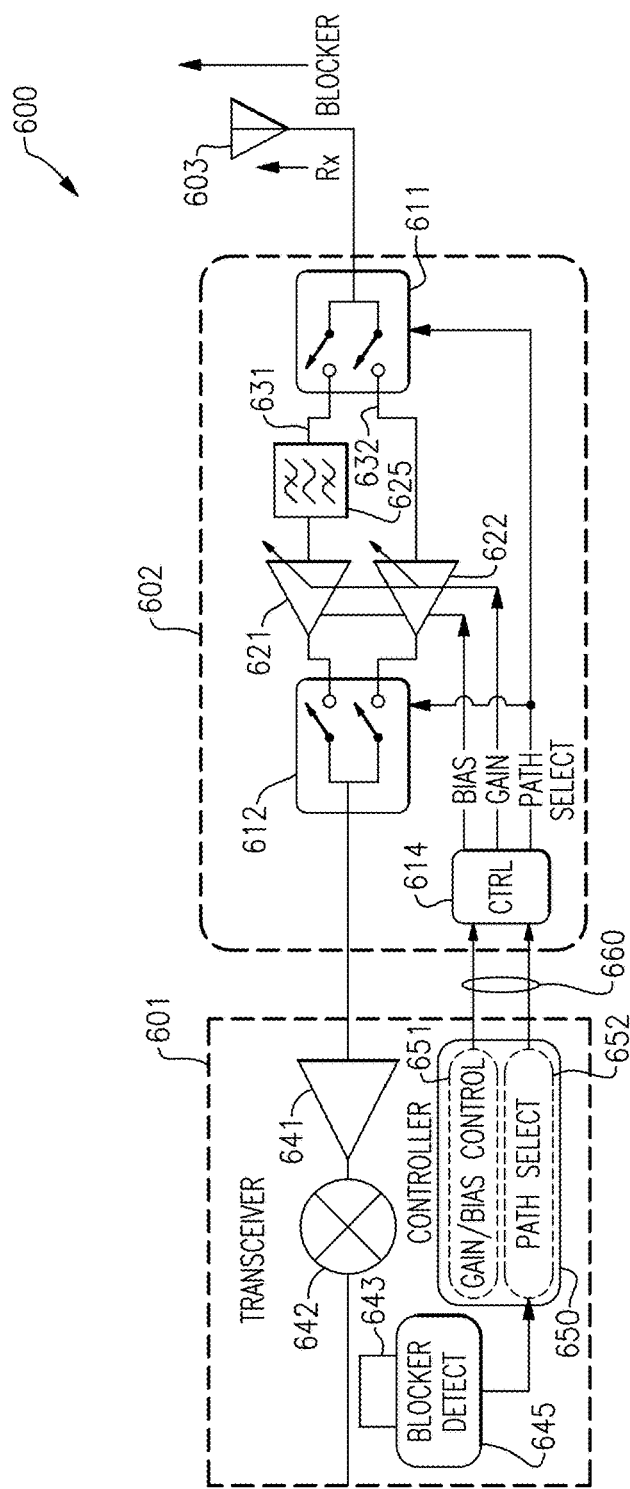
FIG. 8 is a schematic diagram of a receiver system according to another embodiment.

FIG. 8 is a schematic diagram of a receiver system 600 according to another embodiment. The receiver system 600 includes a transceiver 601, receiver front-end circuitry 602, and an antenna 603. The illustrated receiver front-end circuitry 602 includes an antenna switch 611, a bypass switch 612, a receive control circuit 614, a first LNA 621, a second LNA 622, and a receive band filter 625. Additionally, the illustrated transceiver 601 includes an amplifier 641, a mixer 642, a blocker detector 645, and a controller 650.

Although not illustrated in FIG. 8 for clarity, the transceiver 601 can include circuitry associated with transmitting signals over one or more transmit paths and/or one or more additional receive paths. Furthermore, the receiver system 600 can further include a baseband processor and/or other components for processing transmit and receive signals.

The antenna switch 611 and the bypass switch 612 can be used to select a first receive path 631 with blocker filtering or a second receive path 632 without blocker filtering. As shown in FIG. 8, the illustrated embodiment includes a first LNA 621 in the first receive path 631 and a second LNA 622 in the second receive path 632. The first and second LNAs 621, 622 can have the same or different amplification characteristics, depending on implementation and/or application.

As shown in FIG. 8, the output signal from the receiver front-end circuitry 602 is amplified by the transceiver's amplifier 641, and down-converted by the mixer 642. The blocker detector 645 senses an output of the mixer 642 (for instance, via a directional coupler 643), and provides a blocker detection signal to the transceiver's controller 650. The controller 650 includes a gain/bias control circuit 651 and a path select circuit 652 that processes the blocker detection signal to select an appropriate mode or setting for automatic gain control of the receiver front-end circuitry 600.

The transceiver's controller 650 provides a gain/bias control signal and a path select control signal to the receive control circuit 614 of the receiver front-end circuitry 602. In illustrated embodiment, the gain/bias control signal and a path select control signal are provided via a serial interface 660, such as a Mobile Industry Processor Interface (MIPI) bus. The receive control circuit 614 controls the antenna switch 611 and the bypass switch 612 based on the path select control signal, and controls gain and bias settings of the first and second LNAs 621, 622 based on the gain/bias control signal.

Accordingly, the receive filtering and amplification characteristics can be controlled by the transceiver 601, including based on a detected blocker level.

Accordingly, the receiver system 600 of FIG. 8 illustrates an embodiment in which filter connectivity is changed as a function of AGC. For example, the transceiver's controller 651 includes a gain state that provides filter-less reception of signals. Thus, lossy filtering of the receive band filter 625 can be bypassed when signal conditions and the interference environment permit. The blocker level is detected via the blocker detector 645, in this embodiment, thereby allowing receiver gain and noise figure to be improved when blocker levels are low.

Additionally, the receiver system 600 can operate with different gain/bias tunings for different modes. In one example, a receive path with filter bypass and low current settings can be provided in one mode, while a different receive path with filtering and high current settings can be provided in another mode.

FIG. 9 is a schematic diagram of a receiver front-end system 700 according to another embodiment. The receiver front-end system 700 is connected to an antenna 702, and includes a first switch 711, a second switch 712, a third switch 713, a fourth switch 714, a pre-LNA receive band filter 721, an LNA 725, and a post-LNA receive band filter 722.

As shown in FIG. 9, the pre-LNA receive band filter 721 can be selectively bypassed via a first filter bypass 731 and/or the post-LNA receive band filter 722 can be selectively bypassed via a second filter bypass 732.

The illustrated embodiment illustrates one example of a receiver front-end system that includes distributed receive band filters that can be selectively bypassed. However, the teachings herein are applicable to a wide variety of bypass architectures, including, for example, configurations with additional filters, switches, and/or other components and/or a different arrangement of components.

FIG. 10 is a schematic diagram of a receiver front-end system 740 according to another embodiment. The receiver front-end system 740 is connected to an antenna 702, and includes a first switch 741, a second switch 712, a third switch 713, a fourth switch 744, a pre-LNA receive band filter 721, an LNA 725, and a post-LNA receive band filter 722.

The receiver front-end system 740 of FIG. 10 is similar to the receiver front-end system 700 of FIG. 9, except that the receiver front-end system 740 is implemented with a filter and LNA bypass 733 that is selectable by the first switch 741 and the fourth switch 744. The filter and LNA bypass 733 allows bypassing of the pre-LNA receive band filter 721, the LNA 725, and the post-LNA receive band filter 722.

Additional details of the receiver front-end system 740 can be similar to those described earlier.

FIG. 11 is a schematic diagram of a receiver front-end system 750 according to another embodiment. The receiver front-end system 750 is connected to an antenna 702, a first transceiver 761, and a second transceiver 762. Additionally, the receiver front-end system 750 includes a first switch 741, a second switch 712, a third switch 713, a fourth switch 754, a pre-LNA receive band filter 721, an LNA 725, a post-LNA receive band filter 722, and a routing circuit 765.

The receiver front-end system 750 of FIG. 11 is similar to the receiver front-end system 740 of FIG. 10, except that the receiver front-end system 750 further includes the routing circuit 765 for connecting to the first transceiver 761 and the second transceiver 762. The fourth switch 754 and the routing circuit 765 operate to selectively connect the first transceiver 761 or the second transceiver 762 to the antenna 702 via a desired receive path. Including the routing circuit 765 enhances flexibility of the receiver front-end system and permits sharing of circuitry amongst multiple transceivers.

Additional details of the receiver front-end system 750 can be similar to those described earlier.

FIG. 12 is a schematic diagram of a receiver front-end system 770 according to another embodiment. The receiver front-end system 770 is connected to an antenna 702, a first transceiver 761, and a second transceiver 762. Additionally, the receiver front-end system 770 includes an antenna 702, a first switch 741, a second switch 712, a third switch 713, a fourth switch 754, a fifth switch 771, a sixth switch 772, a pre-LNA receive band filter 721, a first LNA stage 775, a second LNA stage 776, a post-LNA receive band filter 722, and a routing circuit 765.

The receiver front-end system 770 of FIG. 12 is similar to the receiver front-end system 750 of FIG. 11, except that the receiver front-end system 770 includes an LNA implemented in multiple stages 775, 776. Additionally, the receiver front-end system 770 includes additional switches to bypass the second LNA stage 776 via the LNA bypass 773.

Accordingly, the receiver front-end system 770 of FIG. 12 provides enhanced flexibility in controlling an amount of gain in a selected receive path, since the number of active LNA stages in the selected receive path can be controlled.

Additional details of the receiver front-end system 770 can be similar to those described earlier.

Figure 13:
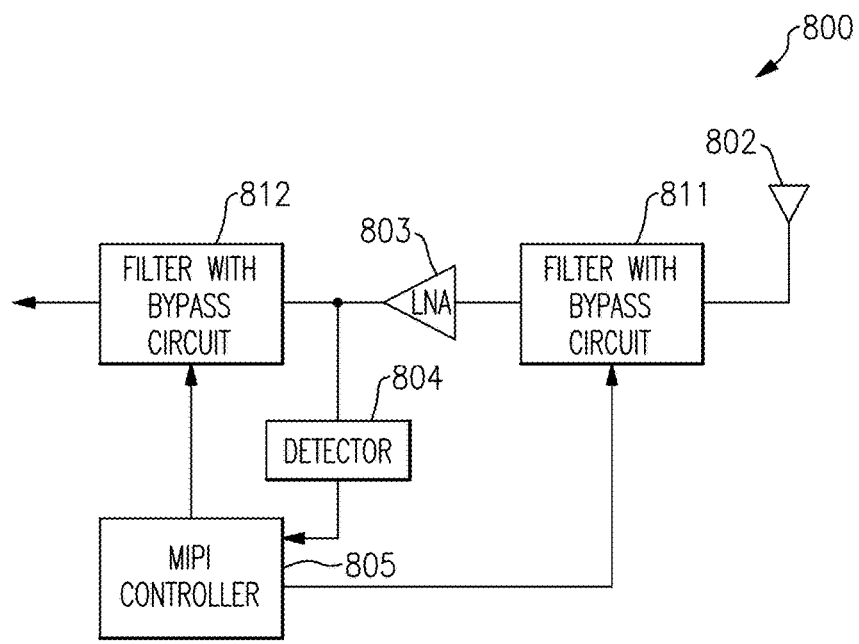
FIG. 13 is a schematic diagram of a receiver front-end system according to another embodiment.

FIG. 13 is a schematic diagram of a receiver front-end system 800 according to another embodiment. The receiver front-end system 800 is connected to an antenna 802, and includes an LNA 803, a detector 804, a MIPI controller 805, a first filter with bypass circuit 811, and a second filter with bypass circuit 812.

The first filter with bypass circuit 811 can be used to selectively filter a received signal from the antenna 811. Additionally, an output of the first filter with bypass circuit 811 is provided to an input of the LNA 803. Additionally, an output of the LNA 803 is provided to the second filter with bypass circuit 812 and to the detector 804. The second filter with bypass circuit 812 can be used to selectively filter the output of the LNA 803.

The detector 804 processes the output of the LNA 803, and can be used to detect a blocker level or strength at the antenna 802. The detector 804 provides a blocker detection signal to the MIPI controller 805, which controls the first filter with bypass circuit 811 and the second filter with bypass circuit 812. Thus, the MIPI controller 805 can be used to selectively activate one or more bypass circuits to bypass filtering.

Additional details of the receiver front-end system 800 can be as described earlier.

Figure 14:
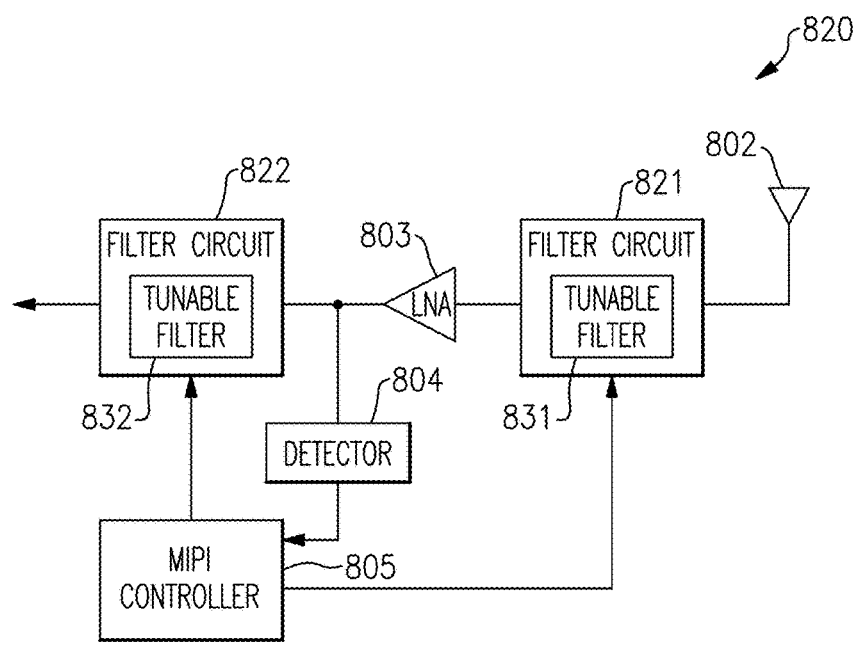
FIG. 14 is a schematic diagram of a receiver front-end system according to another embodiment.

FIG. 14 is a schematic diagram of a receiver front-end system 820 according to another embodiment. The receiver front-end system 820 includes an antenna 802, an LNA 803, a detector 804, a MIPI controller 805, a first filter circuit 821 with a first tunable filter 831, and a second filter circuit 822 with a second tunable filter 822.

The receiver front-end system 820 of FIG. 14 is similar to the receiver front-end system 800 of FIG. 13, except that the receiver front-end system 820 of FIG. 14 includes a MIPI controller 805 that controls an amount of filtering provided by the first and second tunable filters 821, 822 rather than bypassing filters. By controlling the tunable filters, an amount of filtering of the first filter circuit 821 and/or the second filter circuit 822 can be reduced. In certain implementations, the first filter circuit 821 and/or the second filter circuit 822 can be substantially bypassed by tuning the first tunable filter 831 and/or the second tunable filter 832 to provide substantially no filtering.

Additional details of the receiver front-end system 800 can be as described earlier.

Figure 15:
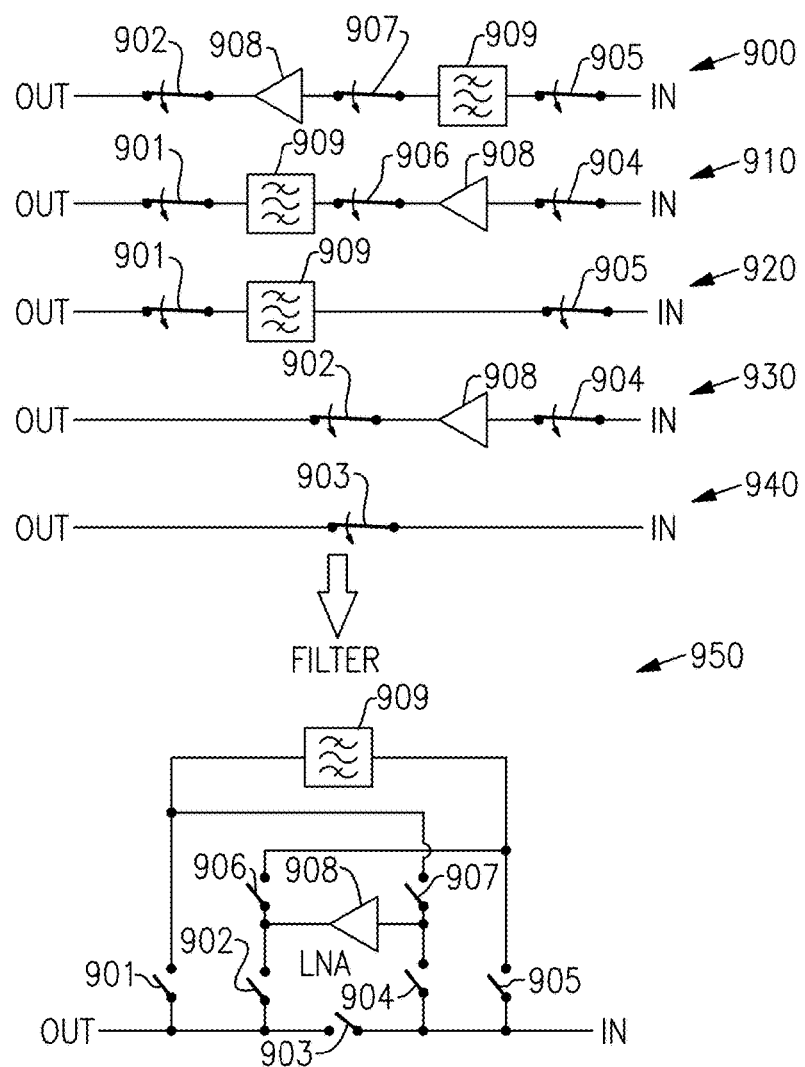
FIG. 15 is a schematic diagram of a receiver front-end system according to another embodiment.

FIG. 15 is a schematic diagram of a receiver front-end system 950 according to another embodiment. The receiver front-end system 950 includes a first switch 901, a second switch 902, a third switch 903, a fourth switch 904, a fifth switch 905, a sixth switch 906, a seventh switch 907, an LNA 908, and a receive band filter 909. The receiver front-end system 950 receives a receive signal at an input IN and generates an output signal at an output OUT.

As shown in FIG. 15, the schematic diagram has also been annotated to show the receiver front-end system 950 with different switch selections or configurations. By opening or closing a particular combination of switches, different combinations of bypassing and signal path orders of the LNA 908 and the receive band filter 909 can be achieved.

As shown in a first switch configuration 900, the fifth switch 905, the receive band filter 909, the seventh switch 907, the LNA 908, and the second switch 902 are electrically connected in a cascade between the input IN and the output OUT. Thus, both the receive band filter 909 and the LNA 908 are in the signal path in the first switch configuration 900, with the receive band filter 909 preceding the LNA 908.

Additionally, in a second switch configuration 910, the fourth switch 904, the LNA 908, the sixth switch 906, the receive band filter 909, and the first switch 901 are electrically connected in a cascade between the input IN and the output OUT. Thus, both the LNA 908 and the receive band filter 909 and are in the signal path in the second switch configuration 910, with the LNA 908 preceding the receive band filter 909.

Furthermore, in a third switch configuration 920, the fifth switch 905, the receive band filter 909, and the first switch 901 are electrically connected in a cascade between the input IN and the output OUT. Thus, the receive band filter 909 but not the LNA 908 is in the signal path in the third switch configuration 920.

Additionally, in a fourth switch configuration 930, the fourth switch 904, the LNA 908, and the second switch 902 are electrically connected in a cascade between the input IN and the output OUT. Thus, the LNA 908 but not the receive band filter 909 is in the signal path in the fourth switch configuration 930.

Furthermore, in a fifth switch configuration 940, the third switch 903 is between the input IN and the output OUT. Thus, neither the LNA 908 nor the receive band filter 909 are in the signal path in the fifth switch configuration 940.

Thus, the receiver front-end system 950 can be used to implemented a filter first receive system, an LNA first receive system, a filter only receive system, an LNA only receive system, or to bypass both the LNA and the filter.

Although FIG. 15 illustrates one specific embodiment of filter and LNA bypass, a wide variety of bypass architectures can be used, including, for example, configurations with additional filters, switches, and/or other components and/or a different arrangement of components.

Figure 16:
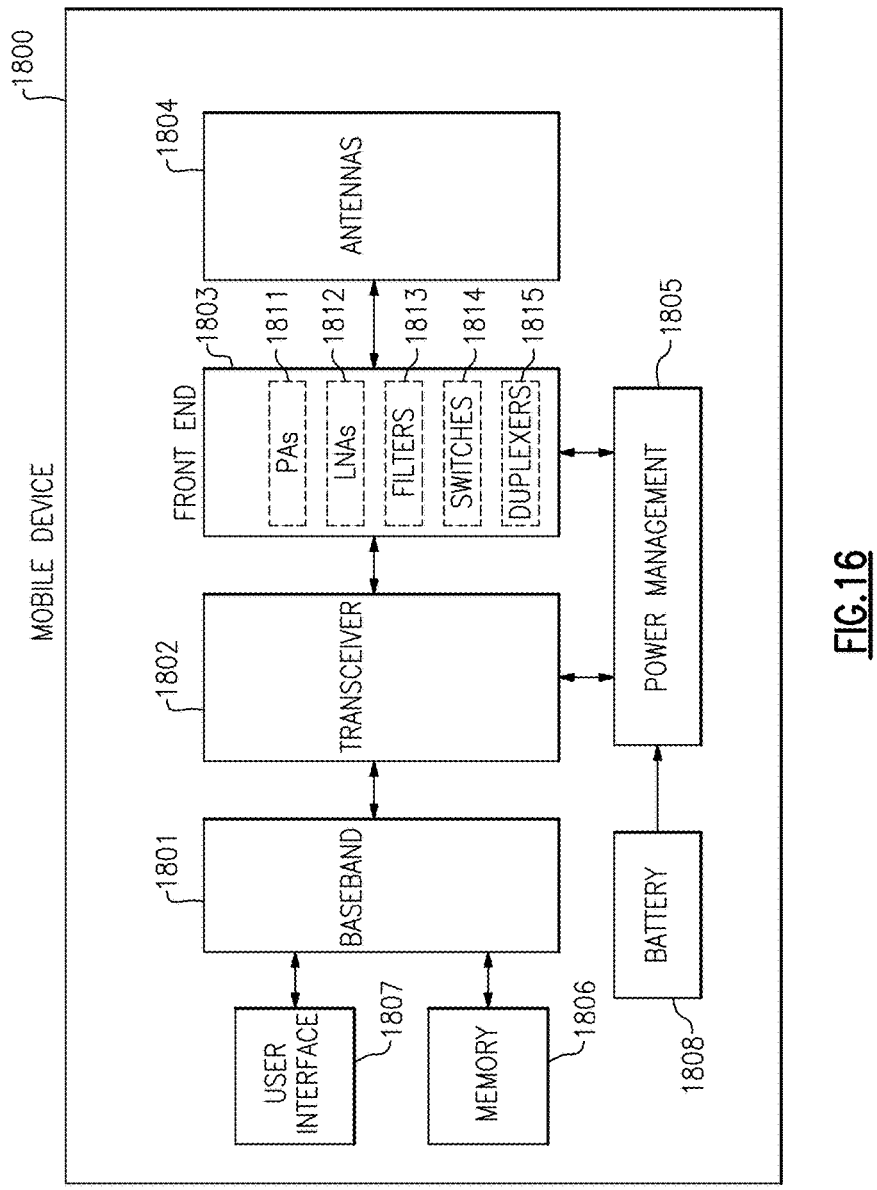
FIG. 16 is a schematic diagram of one embodiment of a mobile device.

FIG. 16 is a schematic diagram of one embodiment of a mobile device 1800. The mobile device 1800 includes a baseband system 1801, a transceiver 1802, a front-end system 1803, one or more antennas 1804, a power management system 1805, a memory 1806, a user interface 1807, and a battery 1808.

The mobile device 1800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 1802 generates RF signals for transmission and processes incoming RF signals received from the antennas 1804. It will be understood that various functionalities associated with the transmission and receiving of RF signals can be achieved by one or more components that are collectively represented in FIG. 16 as the transceiver 1802. In one example, separate components (for instance, separate circuits or dies) can be provided for handling certain types of RF signals.

The front-end system 1803 aids is conditioning signals transmitted to and/or received from the antennas 1804. In the illustrated embodiment, the front-end system 1803 includes one or more power amplifiers (PAs) 1811, one or more low noise amplifiers (LNAs) 1812, one or more filters 1813, one or more switches 1814, and one or more duplexers 1815. However, other implementations are possible.

For example, the front-end system 1803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The front-end system 1803 is implemented using one or more features disclosed herein. For example, filter connectivity of the front-end system 1803 is changed as a function of automatic gain control (AGC). Thus lossy filtering of all or part of the filters 1813 can be bypassed when signal conditions and the surrounding interference environment allow.

In certain implementations, the mobile device 1800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 1804 can include antennas used for a wide variety of types of communications. For example, the antennas 1804 can include antennas for transmitting and/or receiving signals associated with a wide variety of frequencies and communications standards.

In certain implementations, the antennas 1804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1800 can operate with beamforming in certain implementations. For example, the front-end system 1803 can include phase shifters having variable phase controlled by the transceiver 1802. Additionally, the phase shifters are controlled to provide beam formation and directivity for transmission and/or reception of signals using the antennas 1804. For example, in the context of signal transmission, the phases of the transmit signals provided to the antennas 1804 are controlled such that radiated signals from the antennas 1804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1804 from a particular direction. In certain implementations, the antennas 1804 include one or more arrays of antenna elements to enhance beamforming.

The baseband system 1801 is coupled to the user interface 1807 to facilitate processing of various user input and output (I/O), such as voice and data. The baseband system 1801 provides the transceiver 1802 with digital representations of transmit signals, which the transceiver 1802 processes to generate RF signals for transmission. The baseband system 1801 also processes digital representations of received signals provided by the transceiver 1802. As shown in FIG. 16, the baseband system 1801 is coupled to the memory 1806 of facilitate operation of the mobile device 1800.

The memory 1806 can be used for a wide variety of purposes, such as storing data and/or instructions to facilitate the operation of the mobile device 1800 and/or to provide storage of user information.

The power management system 1805 provides a number of power management functions of the mobile device 1800. In certain implementations, the power management system 1805 includes a PA supply control circuit that controls the supply voltages of the power amplifiers 1811. For example, the power management system 1805 can be configured to change the supply voltage(s) provided to one or more of the power amplifiers 1811 to improve efficiency, such as power added efficiency (PAE).

As shown in FIG. 16, the power management system 1805 receives a battery voltage from the battery 1808. The battery 1808 can be any suitable battery for use in the mobile device 1800, including, for example, a lithium-ion battery.

Figure 17A:
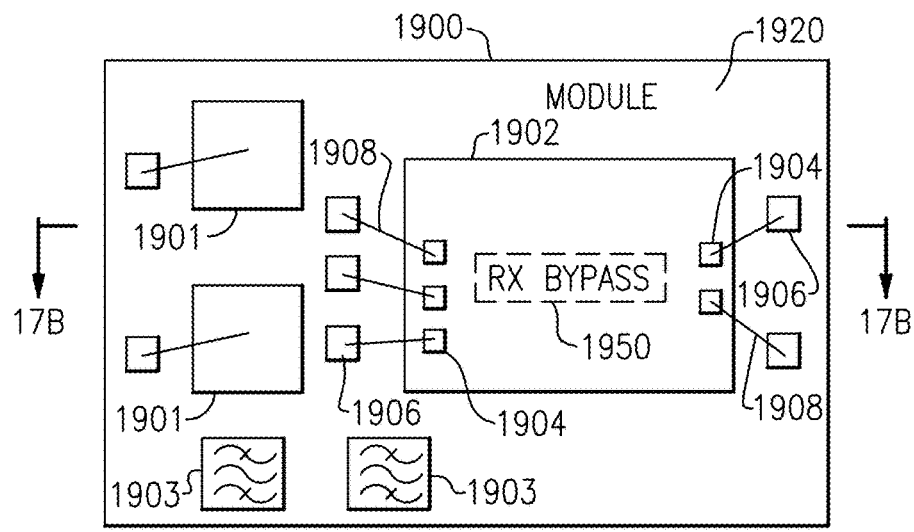
FIG. 17A is a schematic diagram of one embodiment of a packaged module.
Figure 17B:
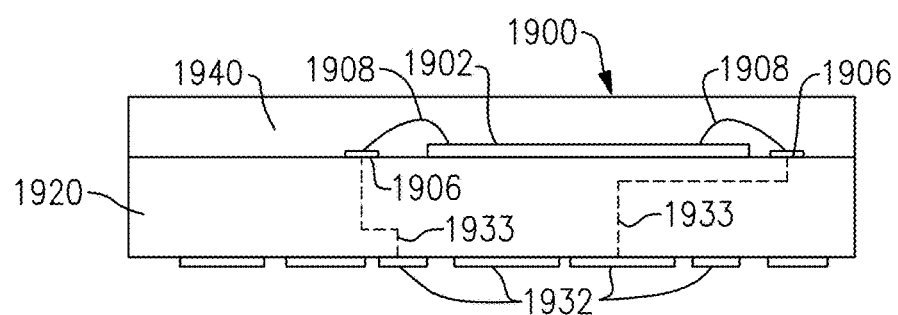
FIG. 17B is a schematic diagram of a cross-section of the packaged module of FIG. 17A taken along the lines 17B-17B.

FIG. 17A is a schematic diagram of one embodiment of a packaged module 1900. FIG. 17B is a schematic diagram of a cross-section of the packaged module 1900 of FIG. 17A taken along the lines 17B-17B.

The packaged module 1900 includes radio frequency components 1901, a semiconductor die 1902, filters 1903, wirebonds 1908, a package substrate 1920, and encapsulation structure 1940. The package substrate 1920 includes pads 1906 formed from conductors disposed therein. Additionally, the semiconductor die 1902 includes pins or pads 1904, and the wirebonds 1908 have been used to connect the pads 1904 of the die 1902 to the pads 1906 of the package substrate 1920.

The semiconductor die 1902 includes a receive bypass 1950. The packaged module 1900 is implemented using one or more features disclosed herein. For example, one or more of the filters 1903 can be bypassed via the RX bypass 1950 when signal conditions and the surrounding interference environment allow. Although the packaged module 1900 illustrates one example of a module implemented in accordance with the teachings herein, other implementations are possible.

The packaging substrate 1920 can be configured to receive a plurality of components such as the semiconductor die 1902 and the filters 1903, which can include, for example, surface acoustic wave (SAW) and/or bulk acoustic wave (BAW) filters.

As shown in FIG. 17B, the packaged module 1900 is shown to include a plurality of contact pads 1932 disposed on the side of the packaged module 1900 opposite the side used to mount the semiconductor die 1902. Configuring the packaged module 1900 in this manner can aid in connecting the packaged module 1900 to a circuit board, such as a phone board of a wireless device. The example contact pads 1932 can be configured to provide radio frequency signals, bias signals, and/or power (for example, a power supply voltage and ground) to the semiconductor die 1902. As shown in FIG. 17B, the electrical connections between the contact pads 1932 and the semiconductor die 1902 can be facilitated by connections 1933 through the package substrate 1920. The connections 1933 can represent electrical paths formed through the package substrate 1920, such as connections associated with vias and conductors of a multilayer laminated package substrate.

In some embodiments, the packaged module 1900 can also include one or more packaging structures to, for example, provide protection and/or facilitate handling.

Such a packaging structure can include overmold or encapsulation structure 1940 formed over the packaging substrate 1920 and the components and die(s) disposed thereon.

It will be understood that although the packaged module 1900 is described in the context of electrical connections based on wirebonds, one or more features of the present disclosure can also be implemented in other packaging configurations, including, for example, flip-chip configurations.

Applications

Some of the embodiments described above have provided examples in connection with mobile devices. However, the principles and advantages of the embodiments can be used for any other systems or apparatus that have needs for filter bypass. Examples of such RF communication systems include, but are not limited to, mobile phones, tablets, base stations, network access points, customer-premises equipment (CPE), laptops, and wearable electronics.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
   an antenna;
   a front-end system including a blocker filter, a low noise amplifier, and a plurality of switches; and
   a transceiver configured to receive a radio frequency signal from the antenna by way of a signal path through the front-end system, the transceiver configured to control the plurality of switches to operate the front-end system in a selected mode chosen from a plurality of modes, including a first mode in which the blocker filter is before the low noise amplifier in the signal path, and a second mode in which the low noise amplifier is before the blocker filter in the signal path.

2. The mobile device of claim 1 wherein the plurality of switches includes a first crosspoint switch and a second crosspoint switch, the low noise amplifier electrically connected between a first output of the first crosspoint switch and a first input of the second crosspoint switch, and the blocker filter connected between a second output of the first crosspoint switch and a second input of the second crosspoint switch.

3. The mobile device of claim 2 wherein an output of the second crosspoint switch is coupled to an input of the first crosspoint switch by a loopback path.

4. The mobile device of claim 1 wherein the plurality of switches includes a first switch connected between an output terminal and an output of the blocker filter, a second switch connected between the output terminal and an output of the low noise amplifier, and a third switch connected between the output terminal and an input terminal.

5. The mobile device of claim 4 wherein the plurality of switches further includes a fourth switch connected between the input terminal and an input to the low noise amplifier, a fifth switch connected between the input terminal and an input to the blocker filter, a sixth switched connected between the output of the low noise amplifier and the input to the blocker filter, and a seventh switch connected between the input of the low noise amplifier and the output of the blocker filter.

6. The mobile device of claim 1 wherein the plurality of modes further includes a third mode in which the blocker filter is in the signal path and the low noise amplifier is bypassed.

7. The mobile device of claim 6 wherein the plurality of modes further includes a fourth mode in which the low noise amplifier is in the signal path and the blocker filter is bypassed.

8. The mobile device of claim 1 wherein the transceiver includes a blocker detector configured to detect a blocker signal level of the radio frequency signal, the transceiver further configured to choose the selected mode based on the detected blocker signal level.

9. The mobile device of claim 1 wherein the transceiver is further configured to change a gain of the low noise amplifier based on the selected mode.

10. The mobile device of claim 1 wherein the transceiver includes an automatic gain control system configured to choose the selected mode.

11. A front-end system for a radio frequency communication device, the front-end system comprising:
    a low noise amplifier;
    a blocker filter;
    a plurality of switches configured to control connectivity of the blocker filter and the low noise amplifier in a signal path through the front-end system; and
    a controller configured to control the plurality of switches to operate the front-end system in a selected mode chosen from a plurality of modes, the plurality of modes including a first mode in which the blocker filter is before the low noise amplifier in the signal path, and a second mode in which the low noise amplifier is before the blocker filter in the signal path.

12. The front-end system of claim 11 wherein the plurality of switches includes a first crosspoint switch and a second crosspoint switch, the low noise amplifier electrically connected between a first output of the first crosspoint switch and a first input of the second crosspoint switch, and the blocker filter connected between a second output of the first crosspoint switch and a second input of the second crosspoint switch.

13. The front-end system of claim 12 wherein an output of the second crosspoint switch is coupled to an input of the first crosspoint switch by a loopback path.

14. The front-end system of claim 11 wherein the plurality of switches includes a first switch connected between an output terminal and an output of the blocker filter, a second switch connected between the output terminal and an output of the low noise amplifier, and a third switch connected between the output terminal and an input terminal.

15. The front-end system of claim 14 wherein the plurality of switches further includes a fourth switch connected between the input terminal and an input to the low noise amplifier, a fifth switch connected between the input terminal and an input to the blocker filter, a sixth switched connected between the output of the low noise amplifier and the input to the blocker filter, and a seventh switch connected between the input of the low noise amplifier and the output of the blocker filter.

16. The front-end system of claim 11 wherein the plurality of modes further includes a third mode in which the blocker filter is in the signal path and the low noise amplifier is bypassed.

17. The front-end system of claim 16 wherein the plurality of modes further includes a fourth mode in which the low noise amplifier is in the signal path and the blocker filter is bypassed.

18. A method of processing received signals in a mobile device, the method comprising:
    receiving a radio frequency signal using an antenna;
    processing the received signal using a signal path through a front-end system, the front-end system including a blocker filter, a low noise amplifier, and a plurality of switches;
    controlling the plurality of switches to operate the front-end system in a first mode in which the blocker filter is before the low noise amplifier in the signal path; and
    controlling the plurality of switches to operate the front-end system in a second mode in which the low noise amplifier is before the blocker filter in the signal path.

19. The method of claim 18 further comprising controlling the plurality of switches to operate the front-end system in a third mode in which the blocker filter is in the signal path and the low noise amplifier is bypassed.

20. The method of claim 19 further comprising controlling the plurality of switches to operate the front-end system in a fourth mode in which the low noise amplifier is in the signal path and the blocker filter is bypassed.

* * * * *